US 9,768,262 B2

United States Patent
Dittmar et al.

(10) Patent No.: US 9,768,262 B2
(45) Date of Patent: Sep. 19, 2017

(54) EMBEDDED CARBON-DOPED GERMANIUM AS STRESSOR FOR GERMANIUM NFET DEVICES

(71) Applicant: International Business Machines Corporation, Armonk, NY (US)

(72) Inventors: Jeffrey L. Dittmar, Troy, NY (US); Keith E. Fogel, Hopewell Junction, NY (US); Sebastian Naczas, Albany, NY (US); Alexander Reznicek, Troy, NY (US); Devendra K. Sadana, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/228,107

(22) Filed: Aug. 4, 2016

(65) Prior Publication Data
US 2016/0343807 A1 Nov. 24, 2016

Related U.S. Application Data

(62) Division of application No. 14/500,345, filed on Sep. 29, 2014, now Pat. No. 9,419,138.

(51) Int. Cl.
| | |
|---|---|
| *H01L 27/12* | (2006.01) |
| *H01L 29/167* | (2006.01) |
| *H01L 29/78* | (2006.01) |
| *H01L 29/66* | (2006.01) |
| *H01L 21/8238* | (2006.01) |
| *H01L 29/16* | (2006.01) |

(Continued)

(52) U.S. Cl.
CPC .... *H01L 29/167* (2013.01); *H01L 21/823807* (2013.01); *H01L 21/823814* (2013.01); *H01L 27/092* (2013.01); *H01L 29/16* (2013.01); *H01L 29/66545* (2013.01); *H01L 29/66575* (2013.01); *H01L 29/7848* (2013.01); *H01L 21/84* (2013.01); *H01L 27/1203* (2013.01)

(58) Field of Classification Search
CPC ............... H01L 29/7848; H01L 21/823814
USPC ................ 257/345, 347, 351; 438/199, 301
See application file for complete search history.

(56) References Cited

U.S. PATENT DOCUMENTS

| | | | |
|---|---|---|---|
| 6,492,216 B1 | 12/2002 | Yeo et al. | |
| 7,145,166 B2 | 12/2006 | Lee | |

(Continued)

OTHER PUBLICATIONS

Yashiki, Y., et al., "Growth and Characterization of Germanium Carbon Thin Films Deposited by VHF Plasma CVD Technique", Photovoltaic Energy Conversion, Conference Record of the 2006 IEEE 4th World Conference on (vol. 2 ), Date of Conference: May 2006, pp. 1608-1611, Conference Location: Waikoloa, HI.

(Continued)

*Primary Examiner* — Sonya D McCall Shepard
(74) *Attorney, Agent, or Firm* — Scully, Scott, Murphy & Presser, P.C.; Daniel P. Morris, Esq.

(57) ABSTRACT

Carbon-doped germanium stressor regions are formed in an nFET device region of a germanium substrate and at a footprint of a functional gate structure. The carbon-doped germanium stressor regions are formed by an epitaxial growth process utilizing monomethylgermane ($GeH_3$—$CH_3$) as the carbon source. The carbon-doped germanium stressor regions that are provided yield more strain in less volume since a carbon atom is much smaller than a silicon atom.

19 Claims, 5 Drawing Sheets

(51) Int. Cl.
*H01L 27/092* (2006.01)
*H01L 21/84* (2006.01)

(56) References Cited

U.S. PATENT DOCUMENTS

| | | | |
|---|---|---|---|
| 7,279,758 B1 | 10/2007 | Li et al. | |
| 7,368,763 B2 | 5/2008 | Miura et al. | |
| 7,528,044 B2 | 5/2009 | Lee | |
| 7,875,511 B2 | 1/2011 | Yaocheng et al. | |
| 7,960,252 B2 | 6/2011 | Chen | |
| 8,232,186 B2* | 7/2012 | Harley | H01L 21/823807 257/E21.633 |
| 8,541,847 B2* | 9/2013 | An | H01L 21/26506 257/368 |
| 2006/0105511 A1* | 5/2006 | Yang | H01L 29/6659 438/197 |
| 2006/0237746 A1 | 10/2006 | Orlowski et al. | |
| 2007/0184600 A1 | 8/2007 | Zhang et al. | |
| 2008/0224218 A1 | 9/2008 | Liu et al. | |
| 2009/0224263 A1 | 9/2009 | Miyashita | |
| 2010/0164020 A1* | 7/2010 | Kronholz | H01L 21/823412 257/408 |
| 2011/0193180 A1* | 8/2011 | Chen | H01L 21/02148 257/411 |
| 2012/0280275 A1 | 11/2012 | Hata et al. | |

OTHER PUBLICATIONS

List of IBM Patents or Patent Applications Treated as Related, dated Aug. 4, 2016, 2 pages.

* cited by examiner

EMBEDDED CARBON-DOPED GERMANIUM AS STRESSOR FOR GERMANIUM NFET DEVICES

BACKGROUND

The present application relates to a semiconductor structure and a method of forming the same. More particularly, the present application relates to a method of forming carbon-doped germanium (i.e., Ge:C) stressor regions in an nFET device region of a germanium substrate. The present application also provides a semiconductor structure that is prepared by such a method.

For more than three decades, the continued miniaturization of metal oxide semiconductor field effect transistors (MOSFETs) has driven the worldwide semiconductor industry. Various showstoppers to continued scaling have been predicated for decades, but a history of innovation has sustained Moore's Law in spite of many challenges. However, there are growing signs today that metal oxide semiconductor transistors are beginning to reach their traditional scaling limits. Since it has become increasingly difficult to improve MOSFETs and therefore complementary metal oxide semiconductor (CMOS) performance through continued scaling, further methods for improving performance in addition to scaling have become critical.

The performance of semiconductor device substrates can be modified by exerting mechanical stresses. For example, hole mobility can be enhanced when the channel region is under compressive stress, while the electron mobility can be enhanced when the channel is under tensile stress. Thus, compressive and/or tensile stresses can be provided in the channel regions of a p-channel field effect transistor (pFET) and/or an n-channel field effect transistor (nFET) to enhance the performance of such devices.

For nFETs containing silicon channels, embedded carbon-doped silicon (i.e., Si:C) has been used since the 32 node as a stressor material to enhanced nFET device performance. For future technology nodes, like 7 nm and beyond, unalloyed germanium, i.e., pure germanium, is being considered as the channel material. As such, a stressor material is needed for forming nFET devices having germanium channels. Also, a stressor material is needed that can apply more strain at small volumes as compared with that which can be obtained using Si:C as a stressor material.

SUMMARY

Carbon-doped germanium stressor regions are formed in an nFET device region of a germanium substrate and at a footprint of a functional gate structure. The carbon-doped germanium stressor regions are formed by an epitaxial growth process utilizing monomethylgermane (GeH$_3$—CH$_3$) as the carbon source. The carbon-doped germanium stressor regions that are provided yield more strain in less volume since a carbon atom is much smaller than a silicon atom. Overall less carbon incorporation into germanium is needed to achieve high strain compared to a silicon germanium alloy (SiGe) which is conventionally used as an nFET stressor element.

In one aspect of the present application, a method of forming a semiconductor structure including carbon-doped germanium stressor regions is provided. The method includes providing a gate structure on a topmost surface of a germanium substrate and in an nFET device region of the germanium substrate. Next, a source-side carbon-doped germanium stressor region is formed on one side of the gate structure, and a drain-side carbon-doped germanium stressor region is formed on another side of the gate structure. In accordance with the present application, the source-side carbon-doped germanium stressor region and the drain-side carbon-doped germanium stressor region are formed by an epitaxial growth process utilizing monomethylgermane as a carbon source.

In another aspect of the present application, a semiconductor structure including carbon-doped germanium stressor regions is provided. The semiconductor structure includes a functional gate structure located on a topmost surface of a germanium substrate and in an nFET device region of the germanium substrate. A source-side carbon-doped germanium stressor region is located on one side of the functional gate structure, and a drain-side carbon-doped germanium stressor region is located on another side of the functional gate structure.

DESCRIPTION

Figure 1:
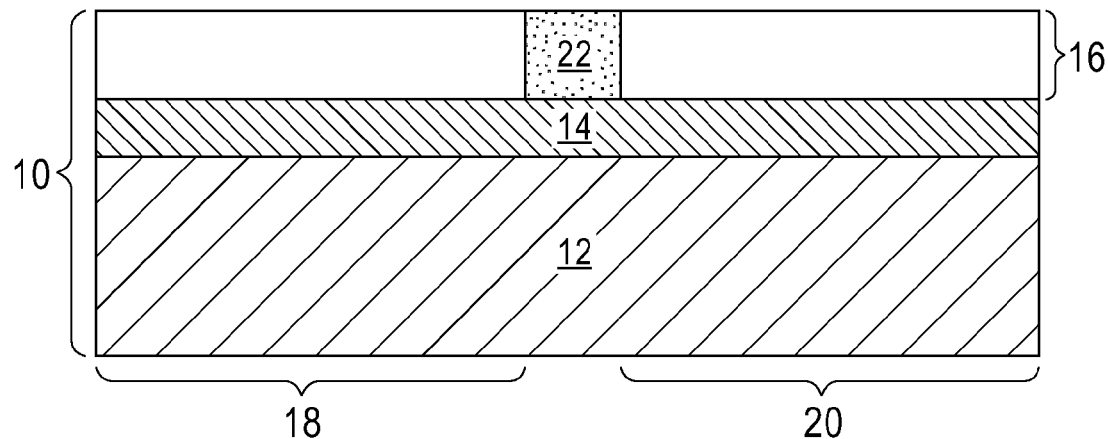
FIG. 1 is a cross sectional view of a first exemplary semiconductor structure including a germanium substrate containing an nFET device region and a pFET device region that can be employed in accordance with an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements in the various embodiments of the present application are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Referring first to FIG. 1, there is illustrated a first exemplary semiconductor structure that can be employed in accordance with an embodiment of the present application. The first exemplary semiconductor structure includes a germanium substrate 10 having an nFET device region 18 and a pFET device region 20. The nFET device region 18 is an area of the germanium substrate 10 in which at least one nFET device will be subsequently formed, while the pFET device region 20 is another area of the germanium substrate 10 in which at least one pFET device will be subsequently formed.

In one embodiment of the present application (not shown), the germanium substrate 10 can be a bulk germanium substrate. By "bulk" it is meant that the germanium substrate 10 is comprised entirely of germanium. In another embodiment (also not shown), the germanium substrate 10 includes a semiconductor material stack in which germanium is the uppermost layer of the semiconductor material stack. In one example, a semiconductor material stack of, from bottom to top, a silicon layer and a germanium layer, can be employed as germanium substrate 10. At least the uppermost portion of the germanium substrate 10 is comprised of a single crystalline germanium.

In a further embodiment of the present application and as shown in FIG. 1, the germanium substrate 10 comprises a germanium-on-insulator (GeOI) substrate. The GeOI substrate includes a handle substrate 12, a buried insulator layer 14 located on a topmost surface of the handle substrate 10, and a germanium layer 16 located above the buried insulator layer 14. In some embodiments (and as shown), a bottommost layer of the germanium layer 16 directly contacts a topmost surface of the buried insulator layer 14. In other embodiments, one or more semiconductor materials are located between the germanium layer 16 and the buried insulator layer 14. The handle substrate 12 provides mechanical support for the buried insulator layer 14 and the germanium layer 16.

In one embodiment of the present application, the handle substrate 12 comprises a semiconductor material. The term "semiconductor" as used herein in connection with the semiconductor material of the handle substrate 12 denotes any material having semiconductor properties including, for example, Si, Ge, SiGe, SiC, SiGeC, and III/V compound semiconductors such as, for example, InAs, GaAs, or InP. Multilayers of these semiconductor materials can also be used as the semiconductor material of the handle substrate 12. In one embodiment, the handle substrate 12 is comprised of germanium. In some embodiments, the handle substrate 12 is a non-semiconductor material including, for example, a dielectric material and/or a conductive material. In yet other embodiments, the handle substrate 12 can be omitted and a substrate including, from bottom to top, an insulator layer and a germanium layer can be used as the germanium substrate 10.

In some embodiments, the handle substrate 12 and the germanium layer 16 may have the same or different crystal orientation. For example, the crystal orientation of the handle substrate 12 and/or the germanium layer 16 may be {100}, {110}, or {111}. Other crystallographic orientations besides those specifically mentioned can also be used in the present application. The handle substrate 12 of the GeOI substrate may be a single crystalline material, a polycrystalline material, or an amorphous material. The germanium layer 16 of the GeOI substrate is a single crystalline material. In some embodiments, the germanium layer 16 that is located atop the buried insulator layer 14 can be processed to include germanium regions having different crystal orientations.

The buried insulator layer 14 of the GeOI substrate may be a crystalline or non-crystalline oxide or nitride. In one embodiment, the buried insulator layer 14 is an oxide such as, for example, silicon dioxide. The buried insulator layer 14 may be continuous or it may be discontinuous. When a discontinuous buried insulator region is present, the insulator region exists as an isolated island that is surrounded by semiconductor material.

The GeOI substrate may be formed utilizing a layer transfer in which a germanium wafer is bonded to another wafer that may include the buried insulator material and the handle substrate. When a layer transfer process is employed, an optional thinning step may follow the bonding of two semiconductor wafers together. The optional thinning step reduces the thickness of the germanium layer 16 to a layer having a thickness that is more desirable.

In one example, the thickness of the germanium layer 16 of the GeOI substrate can be from 10 nm to 100 nm. In another example, the thickness of the germanium layer 16 of the GeOI substrate can be from 50 nm to 70 nm. If the thickness of the germanium layer 16 is not within one of the above mentioned ranges, a thinning step such as, for example, planarization or etching can be used to reduce the thickness of the germanium layer 16 to a value within one of the ranges mentioned above. The buried insulator layer 14 of the GeOI substrate typically has a thickness from 1 nm to 200 nm, with a thickness from 100 nm to 150 nm being more typical. The thickness of the handle substrate 12 of the GeOI substrate is inconsequential to the present application.

In some other embodiments, hybrid germanium substrates which have different surface regions of different crystallographic orientations can be employed as germanium substrate 10. When a hybrid substrate is employed, an nFET is typically formed on a (100) crystal surface, while a pFET is typically formed on a (110) crystal plane. The hybrid substrate can be formed by techniques that are well known in the art.

Germanium substrate 10 may be doped, undoped or contain doped and undoped regions therein. For clarity, the doped regions are not specifically shown in the drawings of the present application. Each doped region within the germanium substrate 10 may have the same, or they may have different conductivities and/or doping concentrations. The doped regions that are present in the germanium substrate 10 are typically referred to as well regions and they are formed utilizing a conventional ion implantation process, gas phase doping or epitaxial growth.

In some embodiments, the germanium substrate 10 can be processed to include at least one trench isolation structure 22 embedded within an upper portion of the germanium substrate 10. The depth of the trench isolation structure 22 may vary. In the embodiment illustrated in FIG. 1, trench isolation structure 22 is embedded within the germanium layer 16 and the bottommost surface of the trench isolation structure 22 directly contacts a topmost surface of the buried insulator layer 14. The trench isolation structure 22 can be formed utilizing a conventional trench isolation process well known to those skilled in the art. For example, lithography, etching and filling of the trench with a trench dielectric such as an oxide may be used in forming the trench isolation structure 22. Optionally, a liner may be formed in the trench prior to trench fill, a densification step may be performed after the trench fill and a planarization process may follow the trench fill as well. The trench isolation structure 22 separates the nFET device region 18 of the germanium substrate 10 from the pFET device region 20 of the germanium substrate 10. Typically, but not necessarily always, the trench isolation structure 22 has a topmost surface that is co-planar with a topmost surface of the germanium substrate 10.

Figure 2:
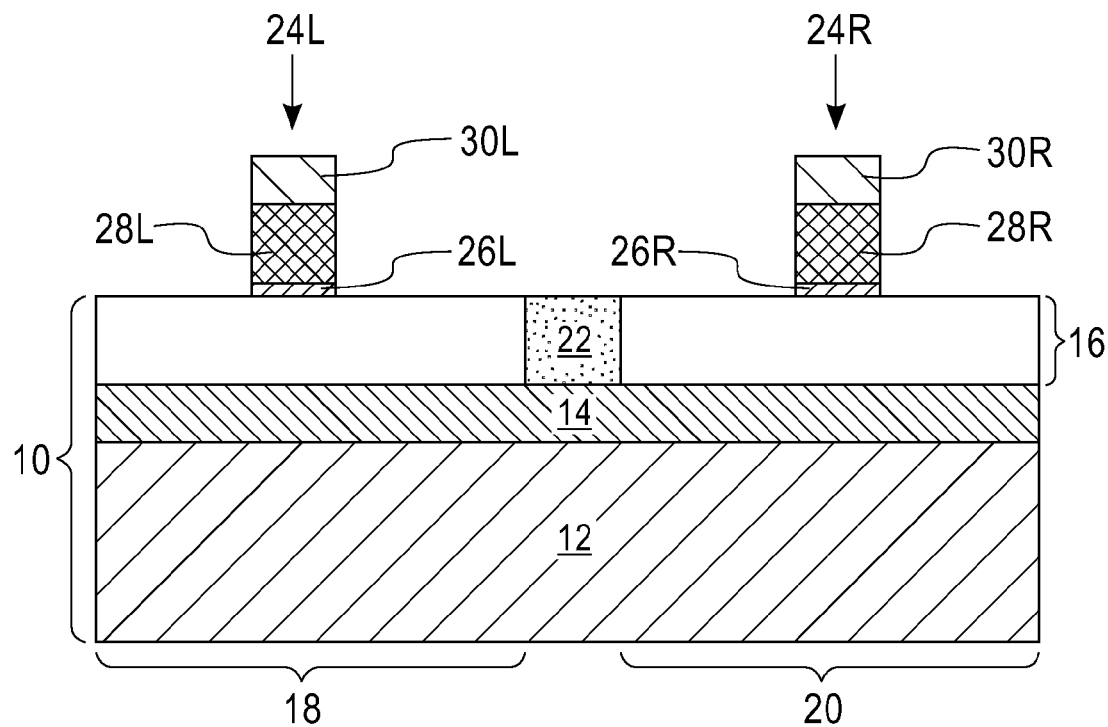
FIG. 2 is a cross sectional view of the first exemplary semiconductor structure of FIG. 1 after providing a first gate structure in the nFET device region and a second gate structure in the pFET device region.

Referring now to FIG. 2, there is illustrated the first exemplary semiconductor structure of FIG. 1 after providing a first gate structure 24L in the nFET device region 18 and a second gate structure 24R in the pFET device region 20. Although a single first gate structure 24L and a single second gate structure 24R are described and illustrated within the various device regions, it is within the scope of the present application to provide a plurality of first gate structures in the nFET device region 18 and a plurality of second gate structures in the pFET device region 20.

In the embodiment illustrated in FIG. 2, the first gate structure 24L includes a first gate stack of, from bottom to top, a first gate dielectric material portion 26L, a first gate conductor material portion 28L, and a first gate cap portion 30L, while the second gate structure 24R includes a second gate stack of, from bottom to top, a second gate dielectric material portion 26R, a second gate conductor material portion 28R, and a second gate cap portion 30R. In some embodiments, the first gate cap portion 30L and/or second gate cap portion 30R can be omitted from atop the corresponding gate conductor material portion.

In this embodiment, the first gate structure 24L and second gate structure 24R are functional gate structures. The term "functional gate structure" is used throughout the present application as a permanent gate structure used to control output current (i.e., flow of carriers in the channel) of a semiconducting device through electrical or magnetic fields.

In some embodiments of the present application, the gate dielectric material portions 26L, 26R, and/or the gate conductor material portions 28L, 28R and/or the gate cap portions 30L, 30R in the nFET device region 14 and the pFET device region 16 are the same. In other embodiments, at least one of the gate dielectric material portions 26L, 26R, the gate conductor material portions 28L, 28R and the gate cap portions 30L, 30R comprises a different material(s). Different materials can be provided utilizing conventional block mask technology.

Each gate dielectric material portion 26L, 26R includes a gate dielectric material. In one embodiment, the gate dielectric material that provides each gate dielectric material portion 26L, 26R can be a semiconductor oxide, a semiconductor nitride, and/or a semiconductor oxynitride. In one example, the gate dielectric material that provides each gate dielectric material portion 26L, 26R can be composed of silicon dioxide, silicon nitride and/or silicon oxynitride. In another embodiment of the present application, the gate dielectric material that provides each gate dielectric material portion 26L, 26R may include at least a dielectric metal oxide. Exemplary dielectric metal oxides that can be used as the gate dielectric material that provides each gate dielectric material portion 26L, 26R include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a dielectric metal oxide can be formed and used as the gate dielectric material that provides each gate dielectric material portion 26L, 26R.

In some embodiments of the present application, the gate dielectric material that provides each gate dielectric material portion 26L, 26R can be formed by a deposition technique such as, for example, chemical vapor deposition (CVD), plasma enhanced chemical vapor deposition (PECVD), physical vapor deposition (PVD), sputtering, or atomic layer deposition. In another embodiment of the present application, the gate dielectric material that provides each gate dielectric material portion 26L, 26R can be formed by a thermal growth technique such as, for example, thermal oxidation and/or thermal nitridation. In yet a further embodiment of the present application, a combination of a deposition and thermal growth may be used in forming a multilayered gate dielectric structure.

In one embodiment of the present application, the gate dielectric material that provides each gate dielectric material portion 26L, 26R can have a thickness in a range from 1 nm to 10 nm. Other thicknesses that are lesser than or greater than the aforementioned thickness range can also be employed for the gate dielectric material that provides each gate dielectric material portion 26L, 26R.

Each gate conductor material portion 28L, 28R may comprise a conductive material. Examples of conductive materials that can provide each gate conductor material portion 28L, 28R include, but are not limited to, doped polysilicon, doped silicon germanium, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), or multilayered combinations thereof. In one embodiment, an entirety of the conductive material that provides each gate conductor material portion 28L, 28R is comprised of a doped polysilicon or doped polysilicon germanium. In another embodiment, a lower portion of the conductive material that provides each gate conductor material portion 28L, 28R is comprised a conductive material other than doped polysilicon or doped polysilicon germanium, and an upper portion of the conductive material that provides each gate conductor material portion 28L, 28R is comprised of doped polysilicon or doped silicon germanium.

The conductive material that provides each gate conductor material portion 28L, 28R can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. In one embodiment, the conductive material that provides each gate conductor material portion 28L, 28R has a thickness from 1 nm to 100 nm. Other thicknesses that are lesser than or greater than the aforementioned thickness range can also be employed for the conductive material that provides each gate conductor material portion 28L, 28R.

Each gate cap portion 30L, 30R can comprise a dielectric hard mask material. Examples of dielectric hard mask materials that can be used to provide each gate cap portion 30L, 30R include, but are not limited to, silicon dioxide, silicon nitride and/or silicon oxynitride. The dielectric hard mask material that can be used to provide each gate cap portion 30L, 30R can be formed utilizing one of the processed mentioned above in forming the gate dielectric material. In one embodiment, the hard mask material that provides each gate cap portion 30L, 30R has a thickness from 10 nm to 100 nm. Other thicknesses that are lesser than or greater than the aforementioned thickness range can also be employed for the hard mask material that provides each gate cap portion 30L, 30R.

The first gate structure 24L and the second gate structure 24R can be formed by first providing a gate material stack of, from bottom to top, a gate dielectric material, a conductive material and, if present a hard mask material. In some embodiments, block mask technology may be used to form different gate dielectric materials and/or conductive materials and/or different hard mask materials within the various device regions. Following the formation of the gate material stack, the gate material stack can be patterned by lithography and etching. Lithography can include forming a photoresist (not shown) on the topmost surface of the gate material stack, exposing the photoresist to a desired pattern of radiation, and then developing the exposed photoresist with a resist developer to provide a patterned photoresist atop the gate material stack. At least one etch is then employed which transfers the pattern from the patterned photoresist into the various materials of the gate material stack. In one embodiment, the etch used for pattern transfer may include a dry etch process such as, for example, reactive ion etching, plasma etching, ion beam etching or laser ablation. In another embodiment, the etch used for pattern transfer may include a wet chemical etchant such as, for example, KOH (potassium hydroxide). In yet another embodiment, a combination of a dry etch and a wet chemical etch may be used to transfer the pattern. After transferring the pattern into the material layers, the patterned photoresist can be removed utilizing a resist stripping process such as, for example, ashing.

As is shown in FIG. 2, the sidewall surfaces of the first gate dielectric material portion 26L, the first gate conductor material portion 28L, and, if present, the first gate cap portion 30L that constituent the first gate structure 24L are vertically coincident to each other. Also, the sidewall surfaces of the second gate dielectric material portion 26R, the second gate conductor material portion 28R, and, if present, the second gate cap portion 30R that constituent the second gate structure 24R are vertically coincident to each other.

In some embodiments, and as shown, the topmost surface of the first gate structure 24L is coplanar with a topmost surface of the second gate structure 24R. In other embodiments, the topmost surface of the first gate structure 24L can be below or above the topmost surface of the second gate structure 24R.

Figure 3:
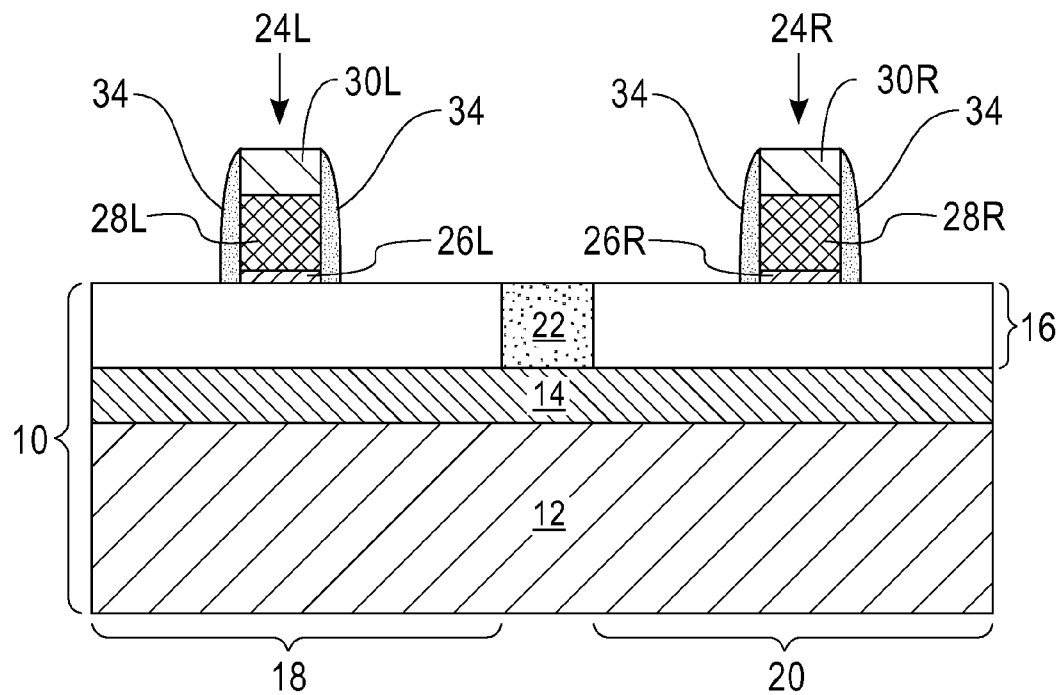
FIG. 3 is a cross sectional view of the first exemplary semiconductor structure of FIG. 2 after forming a spacer on sidewall surfaces of the first gate structure and on sidewall surfaces of the second gate structure.

Referring now to FIG. 3, there is illustrated the first exemplary semiconductor structure of FIG. 2 after forming a spacer 34 on sidewall surfaces of the first gate structure 24L and on sidewall surfaces of the second gate structure 24R. Each spacer 34 can be formed by first providing at least one dielectric spacer material and then etching the at least one dielectric spacer material. The dielectric spacer material may be composed of a dielectric material which may be the same or different from the hard mask material that provides each gate cap portion 30L, 30R. Examples of dielectric spacer materials that can be used in providing each spacer 34 include, for example, a dielectric oxide, dielectric nitride, and/or dielectric oxynitride. In one example, the dielectric spacer material used in providing the spacer 34 may be composed of silicon dioxide or silicon nitride. The dielectric spacer material can be provided by a deposition process including, for example, chemical vapor deposition (CVD), plasma enhanced chemical vapor deposition (PECVD), or physical vapor deposition (PVD). The etching of the dielectric spacer material may comprise a dry etch process such as, for example, a reactive ion etch.

In one embodiment not shown, each spacer 34 may have a pair of vertical sidewall surfaces. In another embodiment (as shown), each spacer 34 has one vertical sidewall surface that makes direct contact with the sidewall surface of the first and second gate structures 24L, 24R and an opposing surface that is non-vertical. In a further embodiment and as shown in FIG. 3, the base of each spacer 34 is located directly on a topmost surface of the germanium substrate 10. In some embodiments (not shown), an L-shaped spacer can be used in conjunction with the spacer 34 illustrated in FIG. 3. In such an embodiment, the L-shaped spacer would be located between spacer 34 and the first and second gate structures 24L, 24R, and the base of spacer 34 would be present on a horizontal portion of the L-shaped spacer.

Figure 4:
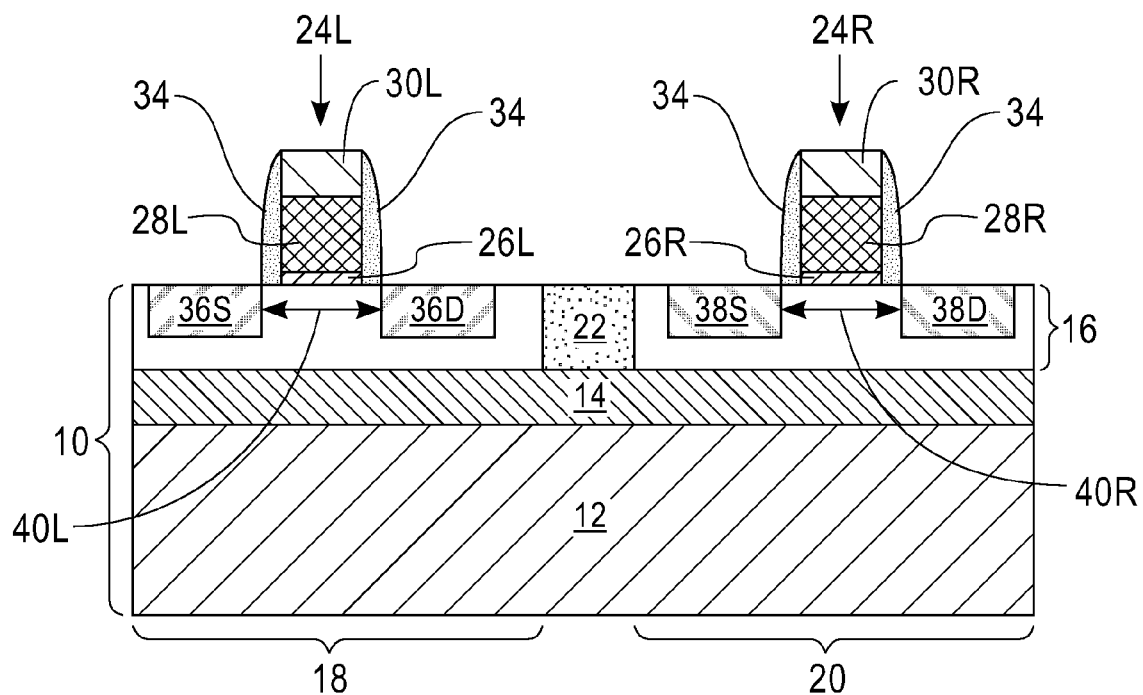
FIG. 4 is a cross sectional view of the first exemplary semiconductor structure of FIG. 3 after forming a source-side carbon-doped germanium (i.e., Ge:C) stressor region and a drain-side Ge:C stressor region embedded in the germanium substrate and on opposite sides of the first gate structure, and forming a source-side germanium tin alloy (i.e., GeSn) stressor region and a drain-side GeSn stressor region embedded in the germanium substrate and on opposite sides of the second gate structure.

Referring now to FIG. 4, there is illustrated the first exemplary semiconductor structure of FIG. 3 after forming a source-side carbon-doped germanium (i.e., Ge:C) stressor region 36S and a drain-side Ge:C stressor region 36D embedded in the germanium substrate 10 and on opposite sides of the first gate structure 24L, and forming a source-side germanium tin alloy (i.e., GeSn) stressor region 38S and a drain-side GeSn stressor region 38D embedded in the germanium substrate 10 and on opposite sides of the second gate structure 24R.

The sequence of forming the Ge:C stressor regions 36S, 36D and the GeSn stressor regions 38S, 38D may vary. In one embodiment of the present application, the Ge:C stressor regions 36S, 36D can be formed prior to forming the GeSn stressor regions 38S, 38D. In another embodiment of the present application, the GeSn stressor regions 38S, 38D can be formed prior to forming the Ge:C stressor regions 36S, 36D.

Each of stressor regions 36S, 36D, 38S and 38D can be formed by first providing a block mask (i.e., photoresist material or hard mask material) over one of the device regions, while leaving the other device region exposed. An etch is then used to provide recessed regions within the germanium substrate 10 and at the footprint of each gate structure in the device region that is exposed. An epitaxial growth process is then used to provide the particular stressor region (i.e., Ge:C stressor regions 36S, 36D or GeSn stressor regions 38S, 38D) in the recessed regions of the exposed device region. After formation of the particular stress region, the block mask can be removed, and the above sequence may be repeated to form the other type of stressor region in the device region that was previously protected by the above mentioned block mask.

The etch that is used to provide the recessed regions in the germanium substrate 10 at the footprint of the gate stack structure may be an anisotropic etch such as, for example, reactive ion etching. The anisotropic etch provides recessed regions having vertical sidewalls. In another embodiment, an isotropic etch can be used to provide recessed regions in the germanium substrate 10 and at the footprint that have tapered sidewalls. In yet another embodiment, a crystallographic etch such as, for example, phosphoric acid and hydrogen peroxide in ethanol (i.e., $H_3PO_4:H_2O_2C_2H_5OH$), can be used to provide recessed regions that have faceted sidewalls. In the embodiment illustrated in the drawings, the recessed regions have vertical sidewalls.

The gate structure and the spacer serve as an etch mask during the etching process that provides the recessed regions. The depth of recessed regions, as measured from the top surface of the germanium substrate 10 to the bottom of the recessed region, is typically from 20 nm to 100 nm.

The Ge:C stressor regions 36S, 36D are formed within the recessed regions that are provided in the germanium substrate 10 and at the footprint of the first gate structure 24L. The Ge:C stressor regions 36S, 36D can be formed by an epitaxial growth (or deposition) process. In some embodiments, an etch back process can follow the epitaxial growth of the carbon-doped germanium material.

The terms "epitaxial growing and/or depositing" and "epitaxially formed and/or grown" are used throughout the present application to denote the growth of a semiconductor material on a deposition surface of a semiconductor material, in which the semiconductor material being grown has the same crystalline characteristics as the semiconductor material of the deposition surface. Thus, in this instance, the Ge:C stressor regions 36S, 36D that are formed in the nFET device region 18 and at the footprint of the first gate structure 24L have an epitaxial relationship, i.e., same crystal orientation, with the growth surfaces of the germanium substrate 10.

In an epitaxial deposition process, the chemical reactants provided by the source gases are controlled and the system parameters are set so that the depositing atoms arrive at the deposition surface of a semiconductor material with sufficient energy to move around on the surface and orient themselves to the crystal arrangement of the atoms of the deposition surface. Therefore, an epitaxial semiconductor material that is formed by an epitaxial deposition process has the same crystalline characteristics as the deposition surface on which it is formed. For example, an epitaxial semiconductor material deposited on a {100} crystal surface will take on a {100} orientation. Examples of various epitaxial growth process apparatuses that are suitable for use in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE).

In one embodiment, a selective epitaxial growth process is employed in providing each Ge:C stressor region 36S, 36D. The selective epitaxial growth of the Ge:C stressor regions 36S, 36D is performed at a temperature from 250° C. to 500° C. In such an embodiment, carbon-doped germanium forms only on germanium surfaces.

In another embodiment, a non-selective epitaxial growth process is employed in providing each Ge:C stressor region 36S, 36D. The non-selective epitaxial growth of the Ge:C stressor regions includes repeating cycles of deposition and etching. The deposition cycles of the non-selective deposition of the Ge:C stressor regions 36S, 36D are performed at a temperature from 250° C. to 500° C. Monomethylgermane is employed as a carbon source during each of the deposition cycles. The etch cycles are performed in a chemical etchant such as, for example, HCl, and the etch temperature is typically from 450° C. to 700° C. The etching cycles remove amorphous Ge:C that forms atop dielectric surfaces during each deposition cycle, while maintaining crystalline Ge:C on the germanium surfaces.

In one embodiment of the present application, the carbon-doped germanium material used in providing the Ge:C stressor regions 36S, 36D can be formed utilizing a precursor gas mixture that can include a germanium source, a carbon source and a carrier gas. Examples of a germanium source include germane, digermane, halogermane, dichlorogermane, trichlorogermane, tetrachlorogermane and combinations thereof. The carbon source that is employed is monomethylgermane ($GeH_3$—$CH_3$). In some embodiments, monomethylgermane is used as both the germanium source as well as the carbon source. Carrier gases like hydrogen, nitrogen, helium and argon can be used.

In accordance with an embodiment of the present application, the carbon-doped germanium material that provides the Ge:C stressor regions 36S, 36D can contain a carbon concentration of from $1\times10^{19}$ atoms/cm$^3$ to $1\times10^{21}$ atoms/cm$^3$. In accordance with another embodiment of the present application, the carbon-doped germanium material that provides the Ge:C stressor regions 36S, 36D can contain a carbon concentration of from $1\times10^{18}$ atoms/cm$^3$ to $2\times10^{20}$ atoms/cm$^3$.

In some embodiments of the present application (and as shown in FIG. 4), the Ge:C stressor regions 36S, 36D have a topmost surface that is coplanar with a topmost surface of the germanium substrate 10. In other embodiments of the present application (not shown), the Ge:C stressor regions 36S, 36D have a topmost surface that is located above or below the topmost surface of the germanium substrate 10. The Ge:C stressor regions 36S, 36D form a tensile germanium channel region 40L in the nFET device region 18 and directly beneath the first gate structure 24L.

The Ge:C stressor regions 36S, 36D that are provided in the present application yield more strain in less volume since a carbon atom is much smaller than a silicon atom. Overall less carbon incorporation into germanium is needed to achieve high strain compared to conventional Si:C stressor elements. In Si:C for appreciable strain at least 1.5% substitutional carbon is required. In the present application, Ge:C needs less than 1% carbon. It is also noted that using monomethylsilane (MMS) for the carbon source does not work with germanium substrates since the decomposition temperature of MMS is higher than the desired growth temperature of germanium. Additionally, silicon atoms will be incorporated into the Ge, which is not the case in the present application in which MMG is used as the carbon source.

The GeSn stressor regions 38S, 38D are formed within the recessed regions that are provided in the germanium substrate 10 and at the footprint of the second gate structure 24R. The GeSn stressor regions 38S, 38D can be formed by an epitaxial growth (or deposition) process. In some embodiments, an etch back process can follow the epitaxial growth of the germanium tin alloy (i.e., GeSn) material that provides each GeSn stressor regions 38S, 38D. The GeSn stressor regions 38S, 38D that are formed in the pFET device region 20 and at the footprint of the second gate structure 24R have an epitaxial relationship, i.e., same crystal orientation, with the growth surfaces of the germanium substrate 10. In some embodiments of the present application (and as shown in FIG. 4), the GeSn stressor regions 38S, 38D have a topmost surface that is coplanar with a topmost surface of the germanium substrate 10. In other embodiments of the present application (not shown), the GeSn stressor regions 38S, 38D have a topmost surface that is located above or below the topmost surface of the germanium substrate 10. The GeSn stressor regions 38S, 38D form a compressive germanium channel region 40R in the pFET device region 20 and directly beneath the second gate structure 24R.

The epitaxial growth of the germanium tin alloy material that provides the GeSn stressor regions 38S, 38D can be performed in one of the apparatuses mentioned above in forming the carbon-doped germanium material used in providing the Ge:C stressor regions 36S, 36D. The temperature for epitaxial deposition of the germanium tin alloy material typically ranges from 550° C. to 900° C. Although higher temperature typically results in faster deposition, the faster deposition may result in crystal defects and film cracking.

In one embodiment of the present application, the germanium tin alloy material used in providing the GeSn stressor regions 38S, 38D can be formed utilizing a precursor gas mixture that can include a germanium source, a tin source and a carrier gas. Examples of a germanium source include germane, digermane, halogermane, dichlorogermane, trichlorogermane, tetrachlorogermane and combinations thereof. Examples of tin sources include tin tetrachloride —SnCl4, or deuterated stannin $SnD_4$. The carrier gas includes on the carrier gases mentioned above in forming the carbon-doped germanium material. In one embodiment of the present application, the germanium tin alloy that provides the GeSn stressor regions 38S, 38D can have a tin content of from 2 atomic % to 15 atomic %.

Figure 5:
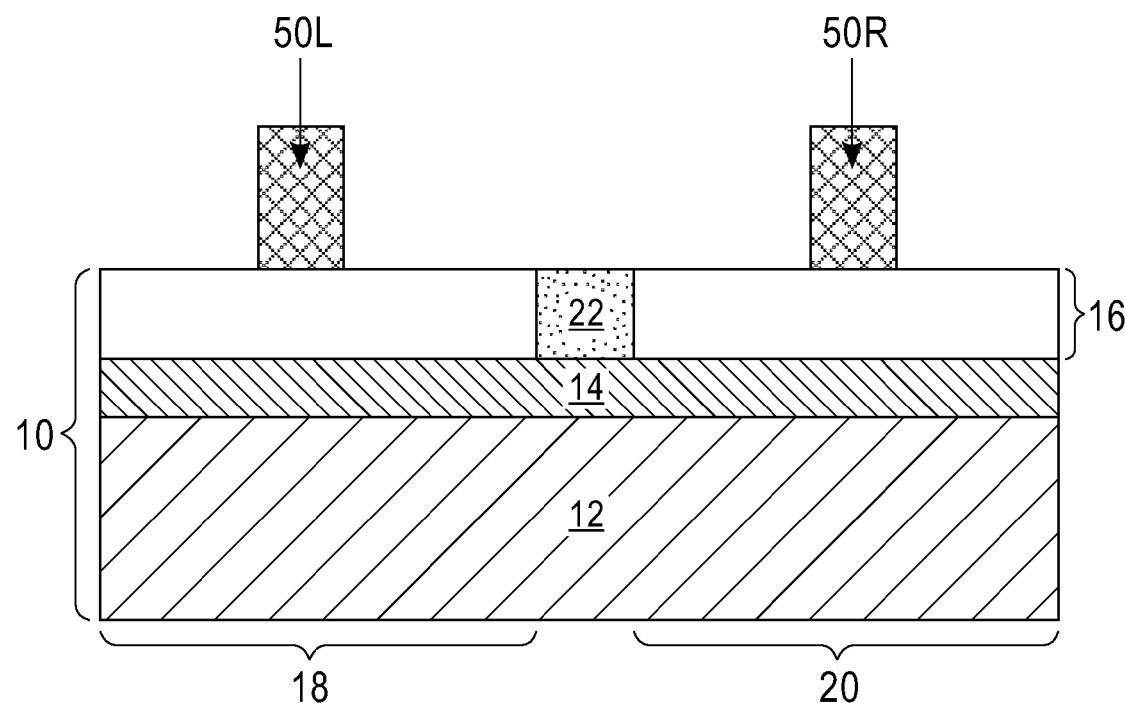
FIG. 5 is a cross sectional view of a second exemplary semiconductor structure including a first sacrificial gate structure in an nFET device region of a germanium substrate and a second sacrificial gate structure in a pFET device region of the germanium substrate that can be employed in another embodiment of the present application.

Referring now to FIG. 5, there is illustrated a second exemplary semiconductor structure including a first sacrificial gate structure 50L in an nFET device region 18 of a germanium substrate 10 and a second sacrificial gate structure 50R in a pFET device region 20 of the germanium substrate 10 that can be employed in another embodiment of the present application. The germanium substrate 10 can be the same as that described above in FIG. 1 of the present application. As such, a trench isolation structure 22 can be present in the germanium substrate 10 to separate the nFET device region 18 from the pFET device region 20. The term "sacrificial gate structure" is used throughout the present application to denote a material that serves as a placeholder structure for a functional gate structure to be subsequently formed.

The first sacrificial gate structure 50L and the second sacrificial gate structure 50R can be formed by first providing a blanket layer of a sacrificial gate material on an upper surface of the germanium substrate 10 shown in FIG. 1. The blanket layer of sacrificial gate material can be formed, for example, by chemical vapor deposition or plasma enhanced chemical vapor deposition. The thickness of the blanket layer of sacrificial gate material can be from 50 nm to 300 nm, although lesser and greater thicknesses can also be employed. The blanket layer of sacrificial gate material can include any material that can be selectively removed from the structure during a subsequently performed etching process. In one embodiment, the blanket layer of sacrificial gate material may be composed of polysilicon. In another embodiment of the present application, the blanket layer of sacrificial gate material may be composed of a metal such as, for example, Al, W, or Cu. After providing the blanket layer of sacrificial gate material, the blanket layer of sacrificial gate material can be patterned by lithography and etching so as to form the first sacrificial gate structure 50L and the second sacrificial gate structure 50R.

Figure 6:
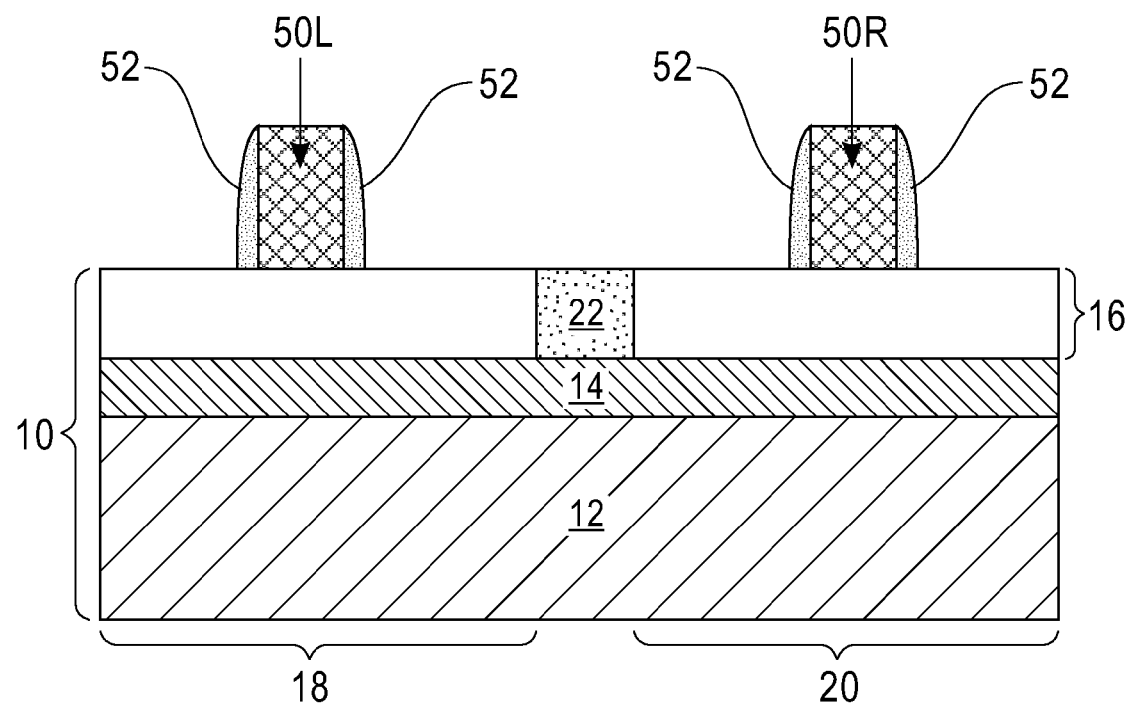
FIG. 6 is a cross sectional view of the second exemplary semiconductor structure after forming a spacer on sidewall surfaces of the first sacrificial gate structure and on sidewall surfaces of the second sacrificial gate structure.

Referring now to FIG. 6, there is illustrated the second exemplary semiconductor structure after forming a spacer 52 on sidewall surfaces of the first sacrificial gate structure 50L and on sidewall surfaces of the second sacrificial gate structure 50R. Spacer 52 includes one of the dielectric spacer material mentioned above in forming spacer 34. Also, spacer 52 can be formed utilizing a process as described above in forming spacer 34.

Figure 7:
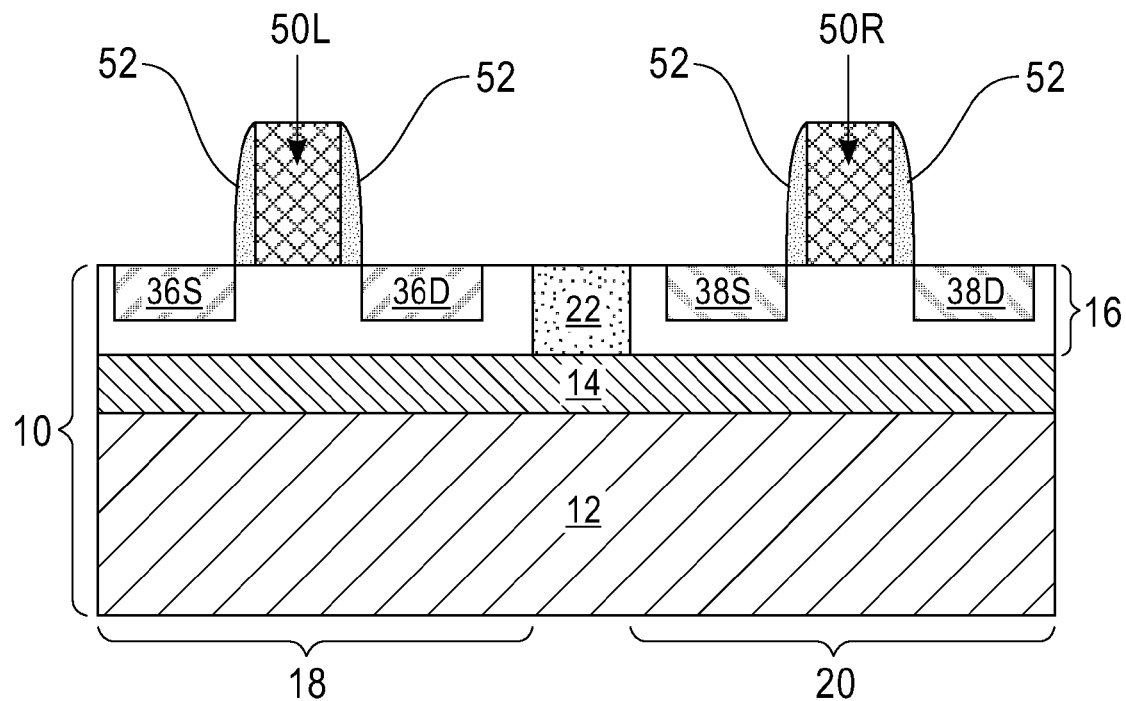
FIG. 7 is a cross sectional view of the second exemplary semiconductor structure of FIG. 6 after forming a source-side carbon-doped germanium (i.e., Ge:C) stressor region and a drain-side Ge:C stressor region embedded in the germanium substrate and on opposite sides of the first sacrificial gate structure, and forming a source-side germanium tin alloy (i.e., GeSn) stressor region and a drain-side GeSn stressor region embedded in the germanium substrate and on opposite sides of the second sacrificial gate structure.

Referring now to FIG. 7, there is illustrated the second semiconductor structure of FIG. 6 after forming a source-side carbon-doped germanium (i.e., Ge:C) stressor region 36S and a drain-side Ge:C stressor region 36D embedded in the germanium substrate 10 and on opposite sides of the first sacrificial gate structure 50L, and forming a source-side germanium tin alloy (i.e., GeSn) stressor region 38S and a drain-side GeSn stressor region 38D embedded in the germanium substrate 10 and on opposite sides of the second sacrificial gate structure 50R. The Ge:C stressor regions 36S, 36D and the GeSn stressor regions 38S, 38D can be formed as described above in providing the same regions to the structure shown in FIG. 4 of the present application. The Ge:C stressor regions 36S, 36D and the GeSn stressor regions 38S, 38D are the same as those mentioned above in providing the same regions to FIG. 4 of the present application.

In some embodiments of the present application, the Ge:C stressor regions 36S, 36D and the GeSn stressor regions 38S, 38D can be formed after formation of the dielectric material 54 (to be subsequently formed). In such an embodiment, stressor regions 36S, 36D, 38S and 38D can be formed either prior to, or after, replacing each sacrificial gate structure 50L, 50R with a functional gate structure 58L, 58R (to be subsequently formed). In such an embodiment, a contact opening is first formed into dielectric material 54 to expose portions of the germanium substrate 10. The exposed portions of the germanium substrate 10 can be recessed and the Ge:C stressor regions 36S, 36D and the GeSn stressor regions 38S, 38D can be formed as described above.

Figure 8:
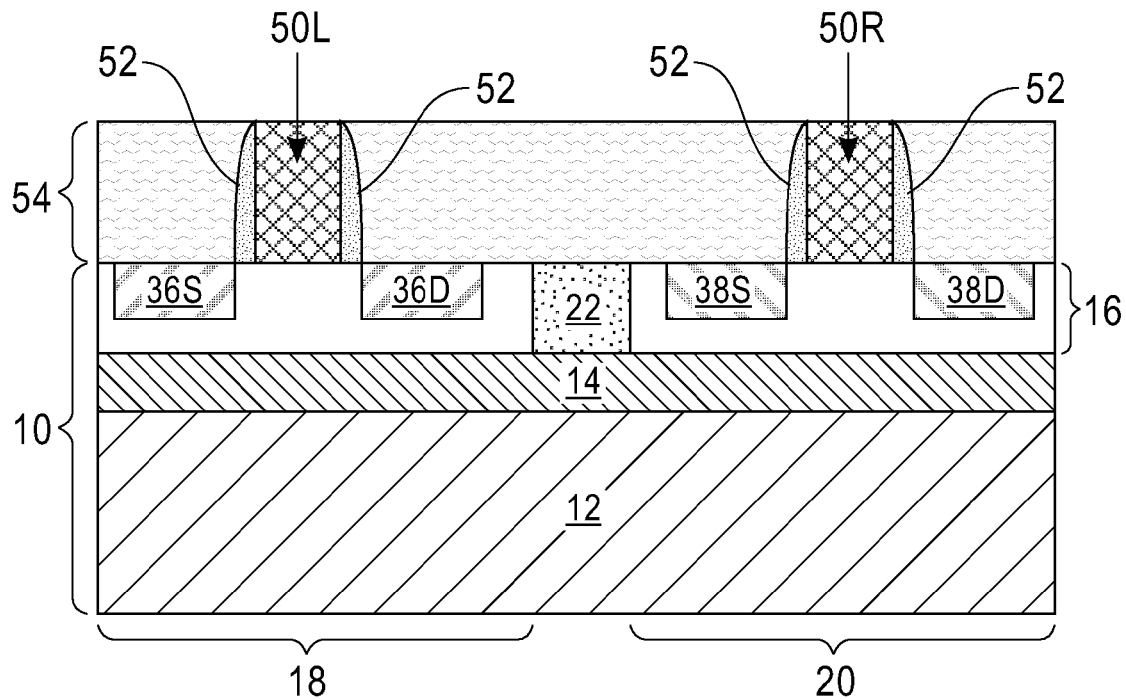
FIG. 8 is a cross sectional view of the second exemplary semiconductor structure of FIG. 7 after forming a dielectric material having a topmost surface that is coplanar with a topmost surface of the first and second sacrificial gate structures.

Referring now to FIG. 8, there is illustrated the second exemplary semiconductor structure of FIG. 7 after forming a dielectric material 54 having a topmost surface that is coplanar with a topmost surface of the first and second sacrificial gate structures (50L, 50R). As such, the topmost surfaces of the first and second sacrificial gate structures 50L, 50R are exposed after forming the dielectric material 54.

In some embodiments, the dielectric material 54 may be composed of, for example, silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide. In another embodiment, a self-planarizing material such as a spin-on glass (SOG) or a spin-on low-k dielectric material such as SiLK™ can be used as the dielectric material 54. The use of a self-planarizing dielectric material as dielectric material 54 may avoid the need to perform a subsequent planarizing step.

In one embodiment, the dielectric material 54 can be formed utilizing a deposition process including, for example, chemical vapor deposition (CVD), plasma enhanced chemical vapor deposition (PECVD), evaporation or spin-on coating. In some embodiments, particularly when non-self-planarizing dielectric materials are used as dielectric material 54, a planarization process or an etch back process follows the deposition of the dielectric material. The thickness of the dielectric material 54 that can be employed in the present application may vary depending on the type of dielectric material employed as well as the method that was employed in forming the same. In one embodiment, the dielectric material 54 has a thickness from 80 nm to 500 nm. Other thicknesses that are greater or lesser than the range provided above can also be used for the dielectric material 54.

Figure 9:
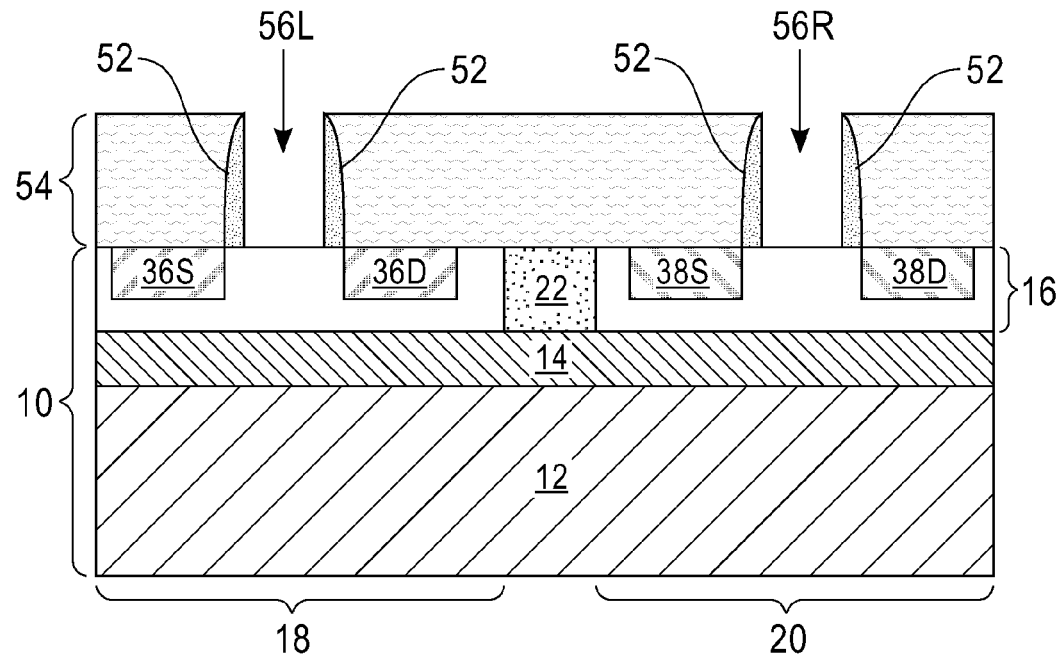
FIG. 9 is a cross sectional view of the second exemplary semiconductor structure of FIG. 8 after forming a first gate cavity in the nFET device region by removing the first sacrificial gate structure, and a second gate cavity in the pFET device region by removing the second sacrificial gate structure.

Referring now to FIG. 9, there is illustrated the second exemplary semiconductor structure of FIG. 8 after forming a first gate cavity 56L in the nFET device region 18 by removing the first sacrificial gate structure 50L, and a second gate cavity 56R in the pFET device region 20 by removing the second sacrificial gate structure 50R. The first and second sacrificial gate structures 50I, 50R can be removed by etching. In one example, the etching used to remove each sacrificial gate structure 50L, 50R is an anisotropic etch such as, for example, reactive ion etching.

Figure 10:
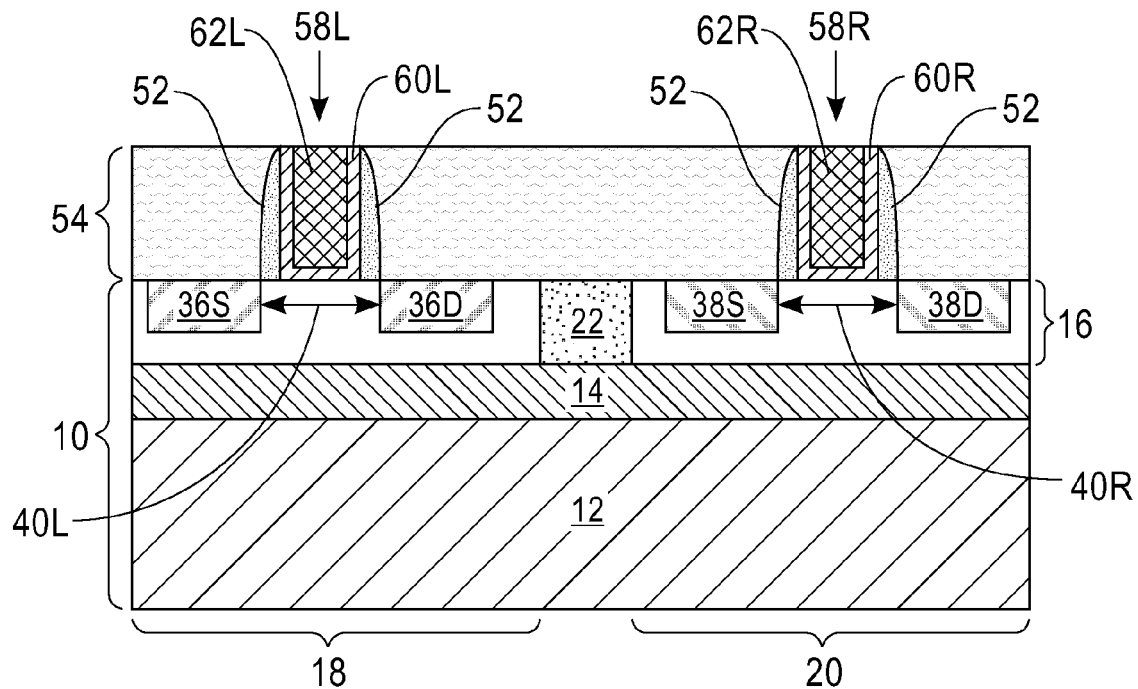
FIG. 10 is a cross sectional view of the second exemplary semiconductor structure of FIG. 9 after forming a first functional gate structure in the first gate cavity and forming a second functional gate structure in the second gate cavity.

Referring now to FIG. 10, there is illustrated the second exemplary semiconductor structure of FIG. 9 after forming a first functional gate structure 58L in the first gate cavity 56L and forming a second functional gate structure 58R in the second gate cavity 56R. The first functional gate structure 58L includes at least a first gate dielectric material portion 60L and a first gate conductor material portion 62L and the second first functional gate structure 58R includes at least a second gate dielectric material portion 60R and a second gate conductor material portion 62R.

The first gate dielectric material portion 60L and the second gate dielectric material portion 60R include one of the gate dielectric materials mentioned above in providing the first gate dielectric material portion 26L and the second gate dielectric material portion 26R to the structure shown in FIG. 2 of the present application. The first gate dielectric material portion 60L and the second gate dielectric material portion 60R may be formed utilizing one of the processes mentioned above in providing the first gate dielectric material portion 26L and the second gate dielectric material portion 26R to the structure shown in FIG. 2 of the present application.

The first gate conductor material portion 62L and the second gate conductor material portion 62R include one of the gate conductor materials mentioned above in providing the first gate conductor material portion 28L and the second gate conductor material portion 28R to the structure shown in FIG. 2 of the present application. The first gate conductor material portion 62L and the second gate conductor material portion 62R may be formed utilizing one of the processes mentioned above in providing the first gate conductor material portion 28L and the second gate dielectric conductor portion 28R to the structure shown in FIG. 2 of the present application.

In some embodiments and as shown in the drawing, the first gate dielectric material portion 60L and the second gate dielectric material portion 60R are U-shaped having a bottommost portion in direct contact with an upper surface of the germanium 10 and vertical portions that are located on exposed sidewalls of each spacer 52. Within each gate cavity (56L, 56R), the gate dielectric material portion (60L, 60R) surrounds the gate conductor material portion (62L, 62R). In another embodiment, the gate dielectric material portion (60L, 60R) is not U-shaped and thus lacks the vertical portions mentioned. In such an embodiment, the gate conductor material portion (62L, 62R) that is formed atop the non-U-shaped gate dielectric fills the remaining portion of the gate cavity (56L, 56R) and has outermost edges that directly contact a sidewall surface of each spacer 52.

The method of the present application for forming the Ge:C stressor regions is not limited to the specific examples mentioned above. Instead, the method of the present application for forming the Ge:C stressor regions can be used in any other processing schemes including, for example, formation of FinFET and semiconductor nanowire devices. Also, the method of the present application is not limited to forming embedded Ge:C stressor regions. Instead, non-embedded Ge:C stressor regions can be formed utilizing the epitaxial growth process mentioned above.

While the present application has been particularly shown and described with respect to various embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed as new is:

1. A semiconductor structure comprising:
   a functional gate structure located on a topmost surface of a germanium substrate and in an nFET device region of said germanium substrate;
   a source-side carbon-doped germanium stressor region located on one side of said functional gate structure, said source-side carbon-doped stressor region consisting of Ge and C atoms; and
   a drain-side carbon-doped germanium stressor region located on another side of said functional gate structure, said drain source-side carbon-doped stressor region consisting of Ge and C atoms.

2. The semiconductor structure of claim 1, wherein said source-side carbon-doped germanium stressor region and said drain-side carbon-doped germanium stressor region are both embedded in said germanium substrate.

3. The semiconductor structure of claim 2, wherein said source-side carbon-doped germanium stressor region and said drain-side carbon-doped germanium stressor region each have a topmost surface that is coplanar with said topmost surface of said germanium substrate.

4. The semiconductor structure of claim 1, wherein said source-side carbon-doped germanium stressor region and said drain-side carbon-doped germanium stressor region each contain a concentration of carbon from $1\times10^{19}$ atoms/cm$^3$ to $1\times10^{21}$ atoms/cm$^3$.

5. The semiconductor structure of claim 1, wherein said source-side carbon-doped germanium stressor region and said drain-side carbon-doped germanium stressor region each contain a concentration of carbon from $1\times10^{18}$ atoms/cm$^3$ to $2\times10^{20}$ atoms/cm$^3$.

6. The semiconductor structure of claim 1, further comprising another functional gate structure in a pFET device region of said germanium substrate.

7. The semiconductor structure of claim 6, further comprising a source-side germanium tin stressor region on one side of said another functional gate structure, and a drain-side germanium tin stressor region on another side of said another functional gate structure.

8. The semiconductor structure of claim 7, wherein said germanium tin stressor region comprises from 2 atomic percent to about 15 atomic percent of tin.

9. The semiconductor structure of claim 8, wherein said source-side germanium tin stressor region and said drain-side germanium tin stressor region are both embedded with said germanium substrate.

10. The semiconductor structure of claim 9, wherein said source-side germanium tin stressor region and said drain-side germanium tin stressor region each have a topmost surface that is coplanar with said topmost surface of said germanium substrate.

11. The semiconductor structure of claim 1, wherein said germanium substrate is present on an insulator layer.

12. The semiconductor structure of claim 1, wherein said functional gate structure comprises a gate dielectric material portion and a gate conductor material portion, wherein a topmost surface of said gate dielectric material portion is coplanar with a topmost surface of said gate conductor material portion.

13. The semiconductor structure of claim 1, further comprising a spacer located on sidewalls of said functional gate structure.

14. The semiconductor structure of claim 13, further comprising a dielectric material located adjacent said spacer, said dielectric material having a topmost surface that is coplanar with a topmost surface of said functional gate structure.

15. The semiconductor structure of claim 1, wherein said source-side carbon-doped germanium stressor region and said drain-side carbon-doped germanium stressor region have a same crystal orientation as said germanium substrate.

16. The semiconductor structure of claim 1, wherein said germanium substrate is present on a silicon layer.

17. The semiconductor structure of claim 1, wherein at least an upper portion of said germanium substrate comprises single crystalline germanium.

18. The semiconductor structure of claim 1, wherein said source-side carbon-doped germanium stressor region and said drain-side carbon-doped germanium stressor region form a tensile germanium channel region located in said germanium substrate and directly beneath said functional gate structure.

19. The semiconductor structure of claim 1, wherein said source-side carbon-doped germanium stressor region and said drain-side carbon-doped germanium stressor region each contains less than 1 percent carbon.

* * * * *